United States Patent
Su et al.

(10) Patent No.: US 8,354,739 B2
(45) Date of Patent: Jan. 15, 2013

(54) THIN SEMICONDUCTOR PACKAGE AND METHOD FOR MANUFACTURING SAME

(75) Inventors: Yeqing Su, Tianjin (CN); Zhigang Bai, Tianjin (CN); Weimin Chen, Tianjin (CN); Wei Shen, Tianjin (CN); Jianhong Wang, Tianjin (CN); Baoguan Yin, Tianjin (CN); Wanming Yu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 158 days.

(21) Appl. No.: 13/092,159

(22) Filed: Apr. 22, 2011

(65) Prior Publication Data

US 2011/0316130 A1    Dec. 29, 2011

(51) Int. Cl.
*H01L 23/495* (2006.01)
*H01L 21/28* (2006.01)

(52) U.S. Cl. ......... 257/666; 257/E23.031; 257/E21.158; 438/111

(58) Field of Classification Search ............ 257/666, 257/E23.031, E21.158; 438/111
See application file for complete search history.

(56) References Cited

U.S. PATENT DOCUMENTS

| | | | |
|---|---|---|---|
| 6,337,510 B1 | 1/2002 | Chun-Jun et al. | |
| 6,396,130 B1 | 5/2002 | Crowley | |
| 6,459,148 B1 | 10/2002 | Chun-Jun et al. | |
| 7,081,403 B1 * | 7/2006 | Kirloskar et al. | 438/612 |
| 7,112,871 B2 | 9/2006 | Shiu | |
| 7,489,026 B2 | 2/2009 | Wang | |
| 7,531,383 B2 | 5/2009 | Lo | |
| 7,554,185 B2 | 6/2009 | Foong | |
| 7,652,357 B2 | 1/2010 | Wang | |
| 7,713,781 B2 | 5/2010 | Wang | |
| 7,713,784 B2 | 5/2010 | Tan | |
| 2003/0082854 A1 * | 5/2003 | Kasahara et al. | 438/123 |
| 2003/0143776 A1 * | 7/2003 | Pedron et al. | 438/106 |
| 2004/0147064 A1 * | 7/2004 | He | 438/127 |
| 2007/0114641 A1 | 5/2007 | Goh | |
| 2008/0009103 A1 | 1/2008 | Xiaochun | |
| 2009/0004775 A1 | 1/2009 | Wang | |
| 2009/0087946 A1 | 4/2009 | Masumoto | |
| 2009/0152710 A1 | 6/2009 | Wang | |
| 2009/0189279 A1 * | 7/2009 | How | 257/737 |
| 2009/0236713 A1 | 9/2009 | Xu | |
| 2012/0038034 A1 * | 2/2012 | Shin et al. | 257/676 |

* cited by examiner

*Primary Examiner* — William D Coleman
(74) *Attorney, Agent, or Firm* — Charles Bergere

(57) ABSTRACT

A method for manufacturing a thin semiconductor package includes providing a lead frame with a removable substrate that has an attaching surface attached to a first surface of the lead frame. The lead frame is formed from an electrically conductive sheet and has leads that extend inwardly from a lead frame boundary towards a central region of the lead frame. A semiconductor die is mounted on the removable substrate at the central region. The semiconductor die has a connection pad surface with die pads on it, and the connection pad surface is attached to the attaching surface of the removable substrate. The lead frame and die are encapsulated with a first encapsulant so that the lead frame is sandwiched between the first encapsulant and the removable substrate. The removable substrate is removed from the lead frame to expose the first surface of the lead frame and then the die pads are electrically connected to respective ones of the leads. The die and lead frame then are encapsulated with a second encapsulant so that the lead frame and die are sandwiched between the first and second encapsulants. Part of the first encapsulant is then removed to reduce the thickness of the package and expose the leads.

19 Claims, 6 Drawing Sheets

THIN SEMICONDUCTOR PACKAGE AND METHOD FOR MANUFACTURING SAME

BACKGROUND OF THE INVENTION

The present invention relates to a method for manufacturing a thin semiconductor package and a thin semiconductor package manufactured by such a method. The method is particularly useful for manufacturing thin semiconductor packages formed from a flagless lead frame.

Semiconductor packages are commonplace and are incorporated into most everyday electronic devices such as laptop computers and mobile telephones. The size and cost requirements of such electronic devices continuously puts demands on the need for thinner semiconductor packages. These semiconductor packages are typically formed from a metal lead frame that usually includes an arrangement of external connection leads and a flag to which is mounted a semiconductor die. As an alternative, semiconductor packages can be formed from a support assembly that includes a substrate (e.g., removable tape) supporting an arrangement of external connection leads and an optional flag. Electrical connection pads of the semiconductor die are electrically connected to the leads of the support assembly with wires. The semiconductor die and wires are then encapsulated, typically by a molding compound, to form the final semiconductor package. However, current manufacturing methods may not adequately provide semiconductor packages that are thin enough to meet the size requirements for certain electronic devices. Furthermore, when attempting to reduce the thickness of semiconductor packages, faults or defects may occur. For instance, during wire bonding a force is applied to both the die electrical connection pads and the external connection leads. This force may cause a trampoline effect (bounce) resulting in defective wire bonds. Accordingly, it would be advantageous to be able to assemble thin semiconductor devices that do not have defects.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
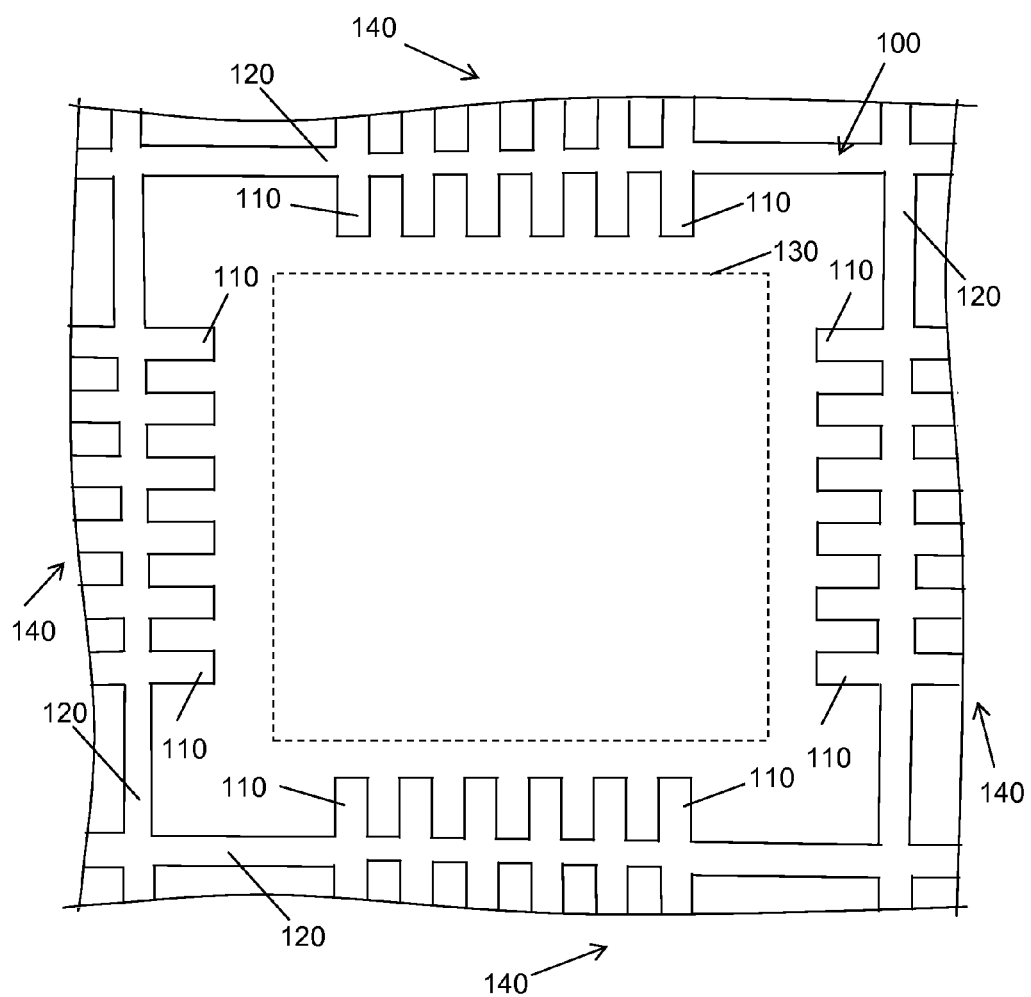
FIG. 1 is a plan view of an underside of a lead frame integrally formed from an electrically conductive sheet in accordance with an embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that system, circuit, device components and method steps that have a list of elements or steps does not include only those elements but may include other elements or steps not expressly listed or inherent to such system, circuit, device components or steps. An element or step proceeded by "comprises . . . a" does not, without more constraints, preclude the existence of additional identical elements or steps that comprises the element or step.

In one embodiment, the present invention provides a method for manufacturing a thin semiconductor package. The method includes providing a lead frame with a removable substrate. The removable substrate has an attaching surface that is attached to a first surface of the lead frame. The lead frame is formed from an electrically conductive sheet and the lead frame has a plurality of external connection leads extending inwardly from a lead frame boundary towards a central region of the lead frame. The method also includes mounting a semiconductor die on the removable substrate at the central region. The semiconductor die has a connection pad surface with die electrical connection pads thereon and the mounting is characterized by the connection pad surface being attached to the attaching surface of the removable substrate. Next the method performs encapsulating the lead frame and semiconductor die with a first encapsulant so that the lead frame is sandwiched between the first encapsulant and removable substrate. A removing process then provides for removing the removable substrate from the lead frame to expose the first surface of the lead frame and then there is performed a process of electrically connecting the die electrical connection pads to respective said external connection leads. The method next performs encapsulating the semiconductor die and lead frame with a second encapsulant so that the lead frame and semiconductor die are sandwiched between the second encapsulant and first encapsulant. A thin semiconductor package is provided by the method removing at least part of the first encapsulant to expose the external connection leads.

In another embodiment, the present invention provides a thin semiconductor package manufactured by a method. The method includes providing a lead frame with a removable substrate. The removable substrate has an attaching surface that is attached to a first surface of the lead frame. The lead frame is formed from an electrically conductive sheet and the lead frame has a plurality of external connection leads extending inwardly from a lead frame boundary towards a central region of the lead frame. The method also includes mounting a semiconductor die on the removable substrate at the central region. The semiconductor die has a connection pad surface with die electrical connection pads thereon and the mounting is characterized by the connection pad surface being attached to the attaching surface of the removable substrate. Next the method performs encapsulating the lead frame and semiconductor die with a first encapsulant so that the lead frame is sandwiched between the first encapsulant and removable substrate. A removing process then provides for removing the removable substrate from the lead frame to expose the first surface of the lead frame and then there is performed a process of electrically connecting the die electrical connection pads to respective said external connection leads. The method next performs encapsulating the semiconductor die and lead frame with a second encapsulant so that the lead frame and semiconductor die are sandwiched between the second encapsulant and first encapsulant. A thin semiconductor package is provided by the method removing at least part of the first encapsulant to expose the external connection leads.

Referring now to FIG. 1, there is illustrated a plan view of an underside of a lead frame 100 integrally formed from an electrically conductive sheet (typically a copper sheet) in accordance with a preferred embodiment of the present invention. The lead frame 100 has a plurality of external connection leads 110 extending inwardly from a lead frame boundary, formed by tie-bars 120, towards a central region 130 of the lead frame 100. This central region 130 is usually where a flag (die paddle) is located, however, the lead frame 100 does not have a flag and it is therefore a flagless lead frame and the central region 130 is indicated in general by a rectangular area outlined in phantom.

As previously mentioned, the lead frame 100 is integrally formed from an electrically conductive sheet and furthermore there are other identical lead frames 140 also formed from the same electrically conductive sheet. Hence, as illustrated, the other identical lead frames 140 share the tie-bars of the lead frame 100.

Figure 2:
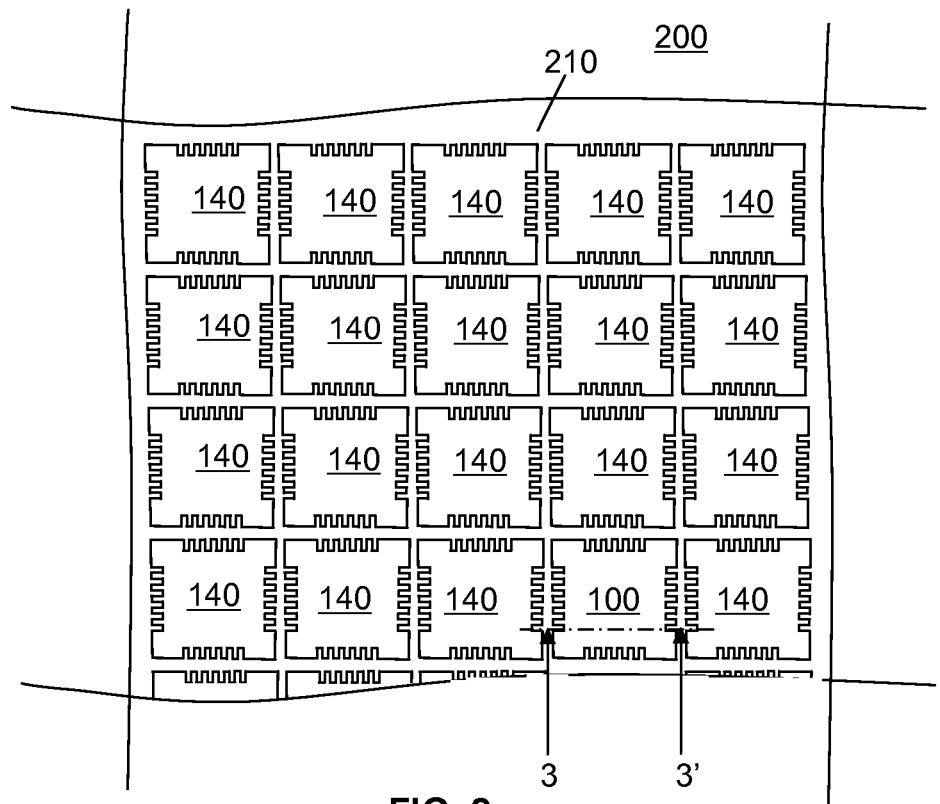
FIG. 2 is a plan view of a sheet of lead frames comprising the lead frame of FIG. 1 and other lead frames in accordance with an embodiment of the present invention.
Figure 3:
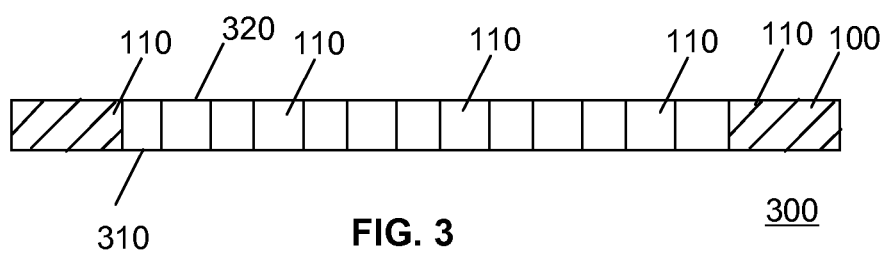
FIG. 3 is a cross-sectional view of the lead frame of FIG. 1 through line 3-3' of FIG. 2.

Referring to FIG. 2 there is illustrated a plan view of a sheet of lead frames 200 comprising the lead frame 100, and the other lead frames 140, that are integrally formed from an electrically conductive sheet 210 in accordance with a preferred embodiment of the present invention. In FIG. 3 there is illustrated a lead frame cross-sectional view 300 through the sheet of lead frames 200, the cross sectional view being a cross sectional view of the lead frame 100. As shown, the lead frame 100 has a first surface 310 and an second, opposite surface 320.

Figure 4:
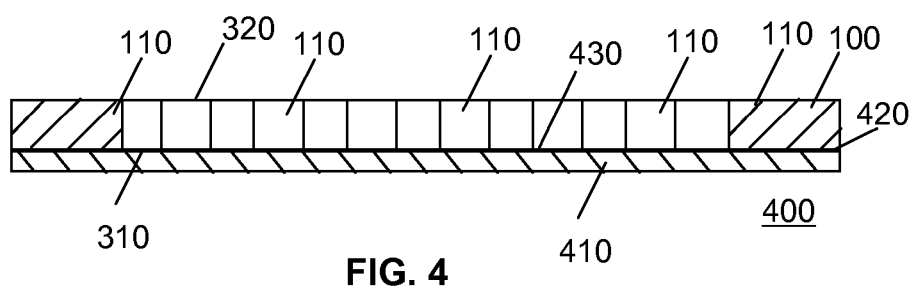
FIG. 4 is a cross-sectional view of a lead frame assembly including the lead frame of FIG. 1 with an attached removable substrate in accordance with an embodiment of the present invention.

Referring to FIG. 4 there is illustrated a cross-sectional view of a lead frame assembly 400 comprising the lead frame 100 with an attached removable substrate 410 in accordance with a preferred embodiment of the present invention. The removable substrate 410 in this embodiment is a flexible sheet and is typically a removable film of polyester resin or any other similar material. The removable substrate 410 has an adhesive 420 on an attaching surface 430 and the removable substrate 410 is attached to the first surface of the lead frame 310 by the adhesive 420.

Figure 5:
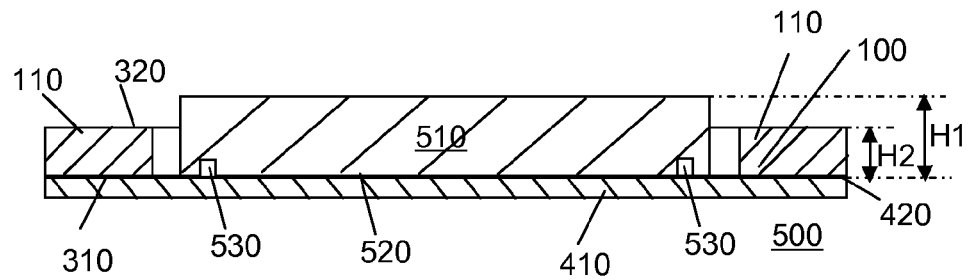
FIG. 5 is a cross-sectional view of a lead frame and die assembly in accordance with an embodiment of the present invention.

Referring to FIG. 5 there is illustrated a cross-sectional view of a lead frame and die assembly 500 in accordance with a preferred embodiment of the present invention. The lead frame and die assembly 500 includes a semiconductor die 510 mounted to the removable substrate 410. The semiconductor die 510 is mounted on the attaching surface 430 of removable substrate 410 at the central region 130. The semiconductor die 510 has a connection pad surface 520 with die electrical connection pads 530 on the connection pad surface 520. The mounting of the semiconductor die 510 to the removable substrate 410 is provided by the connection pad surface 520 being attached to the attaching surface 430 of the removable substrate 410 by the adhesive 420. However, if required, additional adhesive may be applied to the removable substrate 410 in the proximity of the central region 130 or adhesive can be applied to the connection pad surface 520 of the semiconductor die 510. In this illustration it can be seen that the semiconductor die 510 has a height H1 greater than a height H2 of the lead frame 100.

Figure 6:
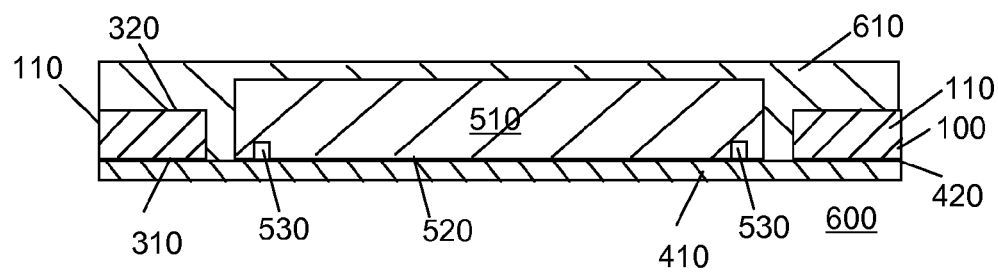
FIG. 6 is a cross-sectional view of a partially encapsulated semiconductor package in accordance with an embodiment of the present invention.

In FIG. 6 there is illustrated a cross-sectional view of a partially encapsulated semiconductor package 600 in accordance with a preferred embodiment of the present invention. The partially encapsulated semiconductor package 600 includes the lead frame and die assembly 500 with a first encapsulant 610. The first encapsulant 610 is a mold compound and as shown the lead frame 100 and semiconductor die 510 are sandwiched between the first encapsulant 610 and the removable substrate 410. Also, as shown the first encapsulant 610 abuts and bonds to the opposite second surface 320 and the semiconductor die 510, and it fills gaps between the semiconductor die 510 and the lead frame 100 in order to abut the removable substrate 410.

Figure 7:
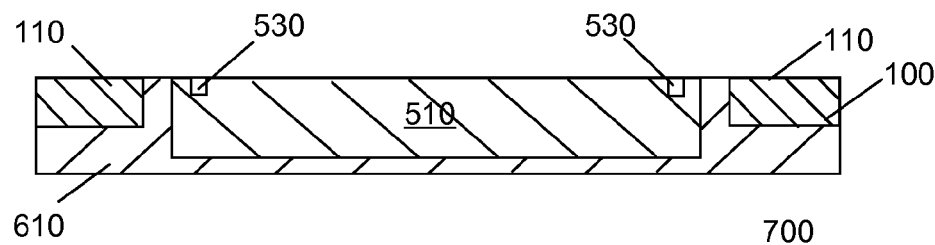
FIG. 7 is a cross-sectional view of an exposed connection pad of a partially encapsulated semiconductor package when in an upright position in accordance with an embodiment of the present invention.

Referring to FIG. 7 there is illustrated a cross-sectional view of an exposed connection pad partially encapsulated semiconductor package 700 when in an upright position in accordance with a preferred embodiment of the present invention. The exposed connection pad partially encapsulated semiconductor package 700 is the partially encapsulated semiconductor package 600 with the removable substrate 410 removed. As a result the connection pad surface 520, electrical connection pads 530 and the first surface 310 are exposed and therefore accessible. In this view, the exposed connection pad partially encapsulated semiconductor package 700 has been flipped over so that the connection pad surface 520, electrical connection pads 530 and the first surface 310 form an upper surface and the first encapsulant 610 forms a support base.

Figure 8:
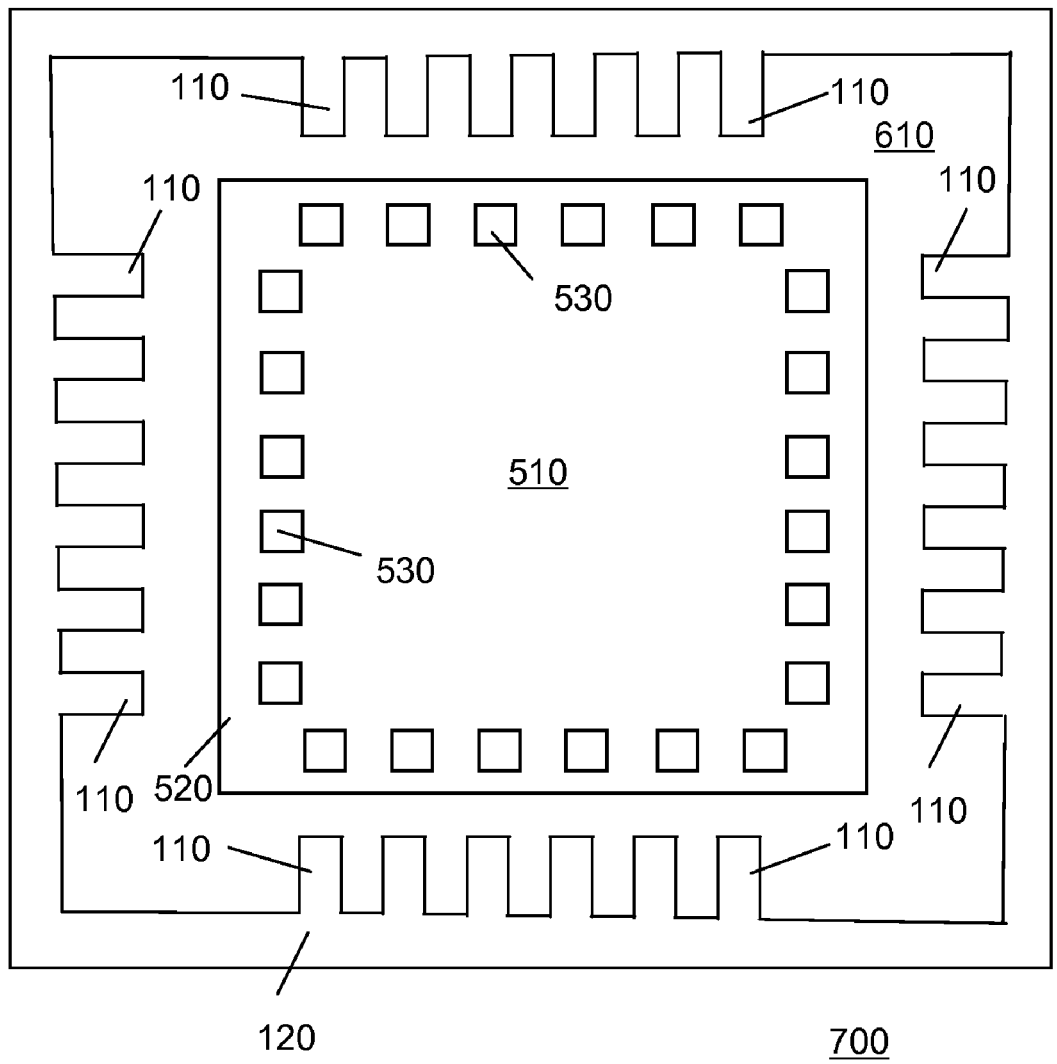
FIG. 8 is a plan view of the exposed connection pad of FIG. 7.

A further illustration of the exposed connection pad partially encapsulated semiconductor package 700 is provided in a plan view in FIG. 8. This illustration shows the first encapsulant 610 disposed between the semiconductor die 510 and tie-bars 120 and between individual adjacent external connection leads 110.

Figure 9:
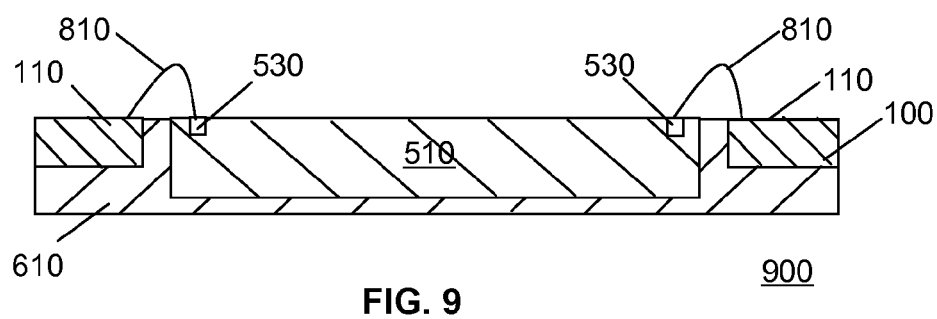
FIG. 9 is a cross-sectional view of a wire-bonded partially encapsulated semiconductor package in an upright position in accordance with an embodiment of the present invention.

Referring to FIG. 9 there is illustrated a cross-sectional view of a wire bonded partially encapsulated semiconductor package 900 when in an upright position in accordance with a preferred embodiment of the present invention. The wire bonded partially encapsulated semiconductor package 900 provides electrical connections by a wire bonding process resulting in electrical connectivity, by wires 810, of the die electrical connection pads 530 to respective ones of the external connection leads 110. More specifically, the wires 810 are bonded to the respective ones of the external connection leads 110 on the first surface 310 and the first encapsulant 610 provides a relatively firm and rigid support that can assist in reducing trampoline effects (bounce) during wire bonding.

Figure 10:
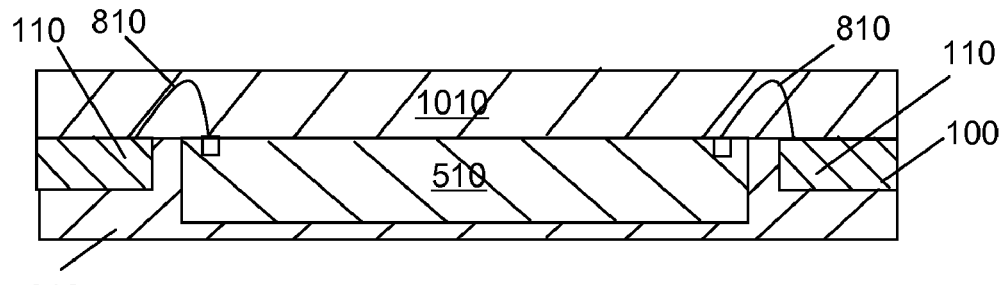
FIG. 10 is a cross-sectional view of a fully encapsulated semiconductor package in an upright position in accordance with an embodiment of the present invention.

Referring to FIG. 10 there is illustrated a cross-sectional view of a fully encapsulated semiconductor package 1000 when in an upright position in accordance with a preferred embodiment of the present invention. The fully encapsulated semiconductor package 1000 has a second encapsulant 1010 that covers the semiconductor die 510, wires 810 and the lead frame 100. As a result, the lead frame 100 and semiconductor die 510 are sandwiched between the first encapsulant 610 and the second encapsulant 1010. As will be apparent to a person skilled in the art, the first and second encapsulants 610 and 1010 comprise mold compounds, which are typically formed from a plastic material. The encapsulants 610, 1010 may be identical or alternatively different. For instance, the first encapsulant 610 may have more rigid properties than the second encapsulant 1010 in order to assist in reducing trampoline effects (bounce) during wire bonding.

Figure 11:
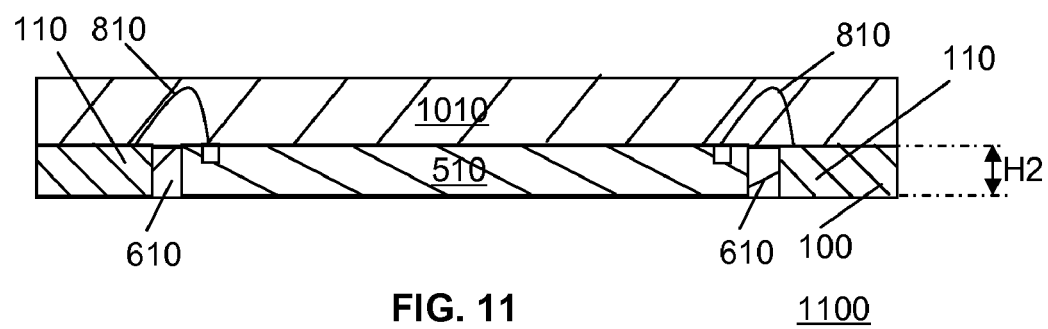
FIG. 11 is a cross-sectional view of a thin semiconductor package in an upright position in accordance with an embodiment of the present invention.

FIG. 11 shows a cross-sectional view of a thin semiconductor package 1100 when in an upright position in accordance with an embodiment of the present invention. The thin semiconductor package 1100 is the fully encapsulated semiconductor package 1000 with most of the first encapsulant 610 and part of the semiconductor die 510 removed so that the external connection leads 110 are exposed. This removal of most of the first encapsulant 610 and part of the semiconductor die 510 is typically performed by grinding, etching or any other suitable means. After the removal of most of the first encapsulant 610 and part of the semiconductor die 510, a planar surface is formed by the opposite second surface 320 of the lead frame, a surface of the first encapsulant 610 and a surface the semiconductor die 510.

Figure 12:
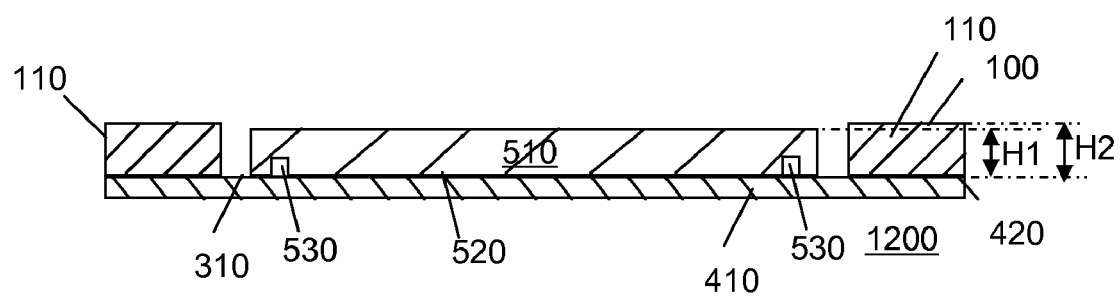
FIG. 12 is a cross-sectional view of a lead frame and die assembly in accordance with another embodiment of the present invention.

Referring to FIG. 12 there is illustrated a cross-sectional view of a lead frame and die assembly 1200 in accordance with another embodiment of the present invention. The lead frame and die assembly 1200 is similar to the lead frame and die assembly 500 and to avoid unnecessary repetition only the differences will be described. In this embodiment of the lead frame and die assembly 1200, it can be seen that the semiconductor die 510 has a height H1 that is less than a height H2 of the lead frame 100. However, in general in this embodiment the semiconductor die 510 has a height H1 no greater than a height H2 of the lead frame 100.

Figure 13:
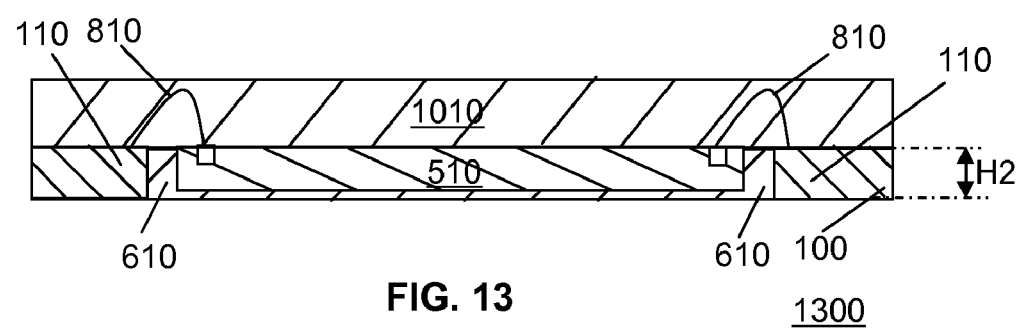
FIG. 13 is a cross-sectional view of a thin semiconductor package in an upright position in accordance with another embodiment of the present invention.

Referring to FIG. 13 there is illustrated a thin semiconductor package 1300 when in an upright position in accordance with yet another embodiment of the present invention. The thin semiconductor package 1300 is formed from the lead frame and die assembly 1200 as will be apparent to a person skilled in the art. The thin semiconductor package 1300 is a fully encapsulated semiconductor package similar to the semiconductor package 1000 with most of the first encapsulant 610 removed so that the external connection leads 110 are exposed. It will be apparent that there is no need for removal of any area of the semiconductor die 510 as its height H1 is less than the height H2 of the lead frame. This removal of most of the first encapsulant 610 is typically performed by grinding, etching or any other suitable means. After the removal of most of the first encapsulant 610 a planar surface is formed by the opposite second surface 310 of the lead frame and a surface of the first encapsulant 610.

Figure 14:
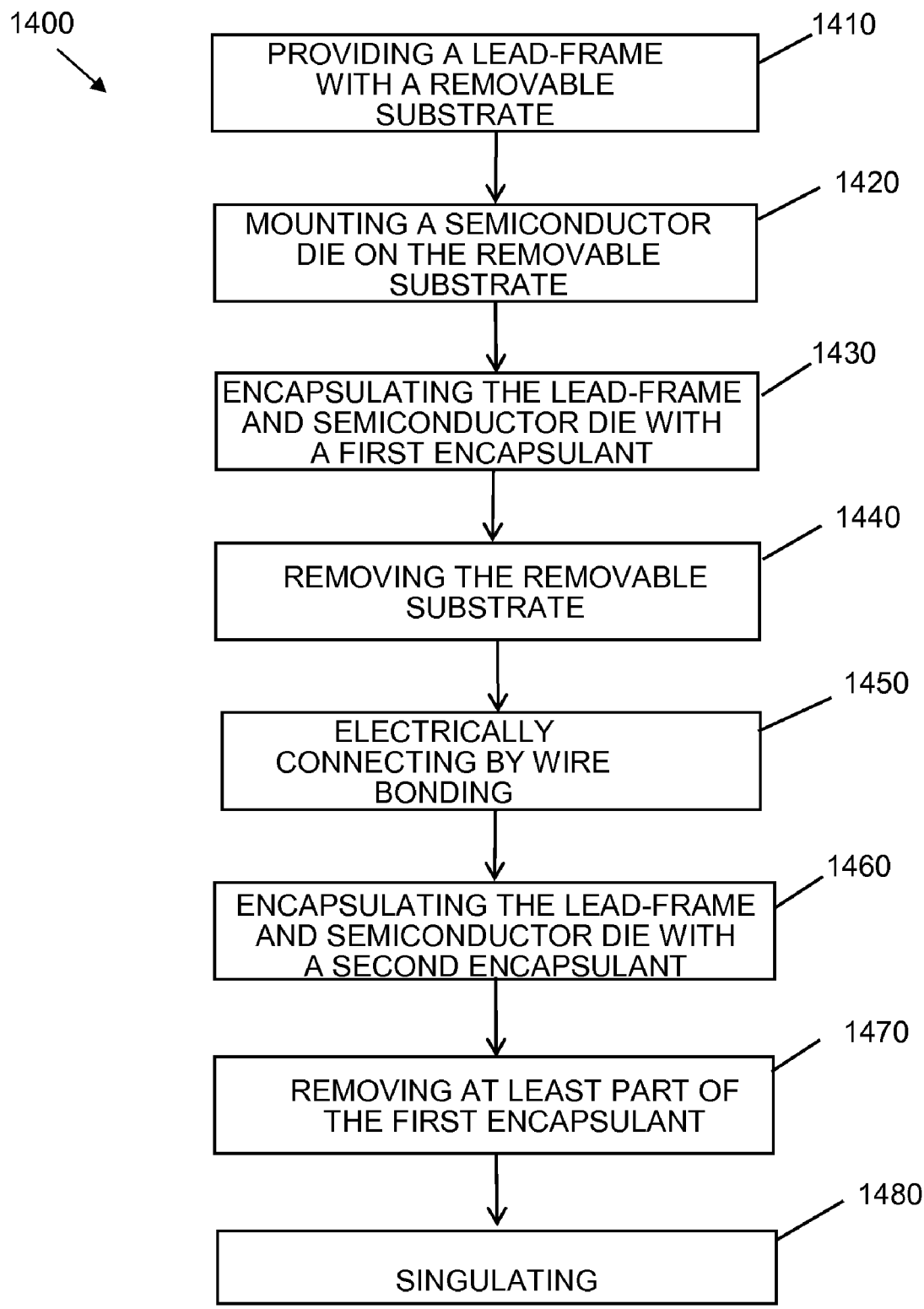
FIG. 14 is flow chart illustrating a method for manufacturing a thin semiconductor package in accordance with an embodiment of the present invention.

In FIG. 14 there is a flow chart illustrating a method 1400 for manufacturing a thin semiconductor package 1100 or 1300 in accordance with a preferred embodiment of the present invention. In this embodiment, the method 1400 refers to the lead frame 100 and the above figures that are associated with the lead frame in order to manufacture the thin semiconductor package 1100 or 1300.

At block 1410, the method includes providing the lead frame 100 with the removable substrate 410. As mentioned above, the removable substrate 410 has an attaching surface 430 that is attached to the first surface 310 of the lead frame 100. The removable substrate 410 is a film with the adhesive 420 on the attaching surface 430 and the adhesive 420 attaches the connection pad surface 520 of the semiconductor die 510 to the removable substrate 410. Also, in one embodiment the adhesive 420 attaches the die electrical connection pads 530 of the semiconductor die 510 to the removable substrate 410.

Next, at step 1420, the semiconductor die 510 is mounted on the removable substrate at the central region 130 thereby resulting in the lead frame and die assembly 500 or 1200. This mounting is characterized by the connection pad surface 520 of the semiconductor die 510 being attached to the attaching surface 430 of the removable substrate 410.

Next, at step 1430 a first encapsulation step is performed, where the lead frame 100 and semiconductor die 510 are encapsulated with a first encapsulant to provide the partially encapsulated semiconductor package 600. The encapsulating step 1430 encapsulates the lead frame 100, and semiconductor die 510 with the first encapsulant 610 (which is a mold compound) so that the lead frame 100 is sandwiched between the first encapsulant 610 and the removable substrate 410. A removing procedure is performed at step 1440, where the removable substrate 410 is removed from the lead frame 100 to expose the first surface 310 of the lead frame 100. The removing procedure at the removing block 1440 results in the exposed connection pad partially encapsulated semiconductor package 700.

At an electrically connecting block 1450, the electrically connecting, by wire bonding, of the die electrical connection pads 530 to the respective external connection leads 110 is performed. The process of electrically connecting, at the connecting block 1450, results in the wire bonded partially encapsulated semiconductor package 900. In one embodiment, the optional process of cleaning the die electrical connection pads 530 in order to remove any adhesive 420 residual or deposits that may be on the die electrical connection pads 530. This process of cleaning the die electrical connection pads 530 is performed before the step of electrically connecting of the die electrical connection pads 530 to the respective external connection leads 110.

At an encapsulating block 1460, the method 1400 performs encapsulating the semiconductor die 510 and lead frame 100 with the second encapsulant 1010 (which is a molded compound) so that the lead frame 100 and semiconductor die 510 are sandwiched between the second encapsulant 1010 and first encapsulant 610. The encapsulating with the second encapsulant 1010 results in the formation of the fully encapsulated semiconductor package 1000.

At removing block 1470, there is performed a process of removing at least part of the first encapsulant 610 to expose the external connection leads 100 of the lead frame. More specifically, the process of removing exposes the opposite second surface 310 of the external connection leads 110 and tie-bars 120 that form the lead frame 100. The removing is performed typically by etching or grinding either most the first encapsulant 610 or most of the first encapsulant 610 and part of the semiconductor die 510. Finally, at a singulating block 1480, a further step of removing the external connection leads 110 from the lead frame boundary (tie-bars 120) is performed. This may also include cutting of punching both the second encapsulant 1010 and first encapsulant 610 if they cover the sheet of lead frames 200 in two single molds instead of being separately molded encapsulants with boundaries defined by each of the tie-bars 120. Upon completion of the method 1400, the completed thin semiconductor package 1100 or 1300 is formed. Typically, the thin semiconductor package 1100 or 1300 is a flagless quad flat package comprising four sides with some of the external connection leads positioned along each of the four sides.

Advantageously, the present invention alleviates or at least reduces some faults caused during wire bonding of thin semiconductor packages due to trampoline effects (bounce). The reduction in some faults caused during wire bonding is provided by the relatively firm and rigid support of the first encapsulant 610 that can assist in reducing trampoline effects (bounce) during the wire bonding process.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method for manufacturing a thin semiconductor package, comprising:
   providing a lead frame with a removable substrate, the removable substrate having an attaching surface that is attached to a first surface of the lead frame, the lead frame being formed from an electrically conductive sheet, wherein the lead frame has a plurality of leads extending inwardly from a lead frame boundary towards a central region of the lead frame;
   mounting a semiconductor die on the removable substrate at the central region, the semiconductor die having a connection pad surface with die pads thereon, wherein the connection pad surface is attached to the attaching surface of the removable substrate;
   encapsulating the lead frame and semiconductor die with a first encapsulant so that the lead frame is sandwiched between the first encapsulant and the removable substrate;
   removing the removable substrate from the lead frame to expose the first surface of the lead frame;
   electrically connecting the die pads to respective ones of the plurality of leads;
   encapsulating the semiconductor die and the lead frame with a second encapsulant so that the semiconductor die and the lead frame are sandwiched between the second encapsulant and first encapsulant; and
   removing at least part of the first encapsulant to at least partially expose the leads.

2. The method of claim 1, wherein the mounting is characterized by the removable substrate being a film with an adhesive on the attaching surface, and wherein the adhesive attaches the connection pad surface of the semiconductor die to the removable substrate.

3. The method of claim 1, wherein the semiconductor die has a height no greater than a height of the lead frame.

4. The method of claim 1, wherein the removing includes grinding the first encapsulant.

5. The method of claim 1, wherein the removing includes etching the first encapsulant.

6. The method of claim 1, wherein the encapsulating the lead frame and semiconductor die with a first encapsulant is further characterized by the semiconductor die and the lead frame being sandwiched between the first encapsulant and the removable substrate.

7. The method of claim 1, wherein the first encapsulant and the second encapsulant are mold compounds.

8. The method of claim 1, further comprising a step of singulating the leads from the lead frame boundary.

9. The method of claim 1, wherein the thin semiconductor package is a flagless quad flat package having four sides, wherein some of the leads are positioned along each of the four sides.

10. The method of claim 2, wherein the adhesive attaches the die pads of the semiconductor die to the removable substrate.

11. The method of claim 10, further including a step of cleaning the die pads before the electrically connecting step.

12. The method of claim 4, wherein the removing includes grinding at least a portion of the semiconductor die.

13. The method of claim 5, the semiconductor die has a height greater than a height of the lead frame.

14. A thin semiconductor package manufactured by a method comprising:
    providing a lead frame with a removable substrate, the removable substrate having an attaching surface that is attached to a first surface of the lead frame, the lead frame being formed from an electrically conductive sheet, wherein the lead frame has a plurality of leads extending inwardly from a lead frame boundary towards a central region of the lead frame;
    mounting a semiconductor die on the removable substrate at the central region, the semiconductor die having a die pad surface with die pads thereon, wherein the die pad surface is attached to the attaching surface of the removable substrate;
    encapsulating the lead frame and the semiconductor die with a first encapsulant so that the lead frame is sandwiched between the first encapsulant and the removable substrate;
    removing the removable substrate from the lead frame to expose the first surface of the lead frame;
    electrically connecting the die pads to respective ones of the plurality of leads;
    encapsulating the semiconductor die and the lead frame with a second encapsulant so that the lead frame and semiconductor die are sandwiched between the first and second encapsulants; and
    removing at least part of the first encapsulant to expose at least a portion of the leads.

15. The thin semiconductor package of claim 14, wherein the thin semiconductor package is a flagless quad flat package having four sides, wherein some of the leads are positioned along each of the four sides.

16. The thin semiconductor package of claim 14, wherein the semiconductor die has a height that is no greater than a height of the lead frame.

17. The thin semiconductor package of claim 14, the semiconductor die has a height that is greater than a height of the lead frame.

18. The thin semiconductor package of claim 14, wherein the removable substrate comprises a film with an adhesive on the attaching surface, and wherein the adhesive attaches the die pad surface of the semiconductor die to the removable substrate.

19. The thin semiconductor package of claim 14, wherein a portion of the semiconductor die is removed.

* * * * *